United States Patent
Akiyama et al.

(10) Patent No.: US 8,030,717 B2
(45) Date of Patent: Oct. 4, 2011

(54) SEMICONDUCTOR DEVICE

(75) Inventors: Koji Akiyama, Nirasaki (JP); Wenwu Wang, Beijing (CN)

(73) Assignees: Tokyo Electron Limited, Tokyo (JP); National Institute of Advanced Industrial Science and Technology, Tokyo (JP)

( * ) Notice: Subject to any disclaimer, the term of this patent is extended or adjusted under 35 U.S.C. 154(b) by 0 days.

(21) Appl. No.: 12/401,772

(22) Filed: Mar. 11, 2009

(65) Prior Publication Data

US 2010/0065927 A1 Mar. 18, 2010

(30) Foreign Application Priority Data

Sep. 18, 2008 (JP) ................. 2008-239214

(51) Int. Cl.
*H01L 29/76* (2006.01)
*H01L 29/94* (2006.01)
*H01L 31/062* (2006.01)
*H01L 31/113* (2006.01)
*H01L 31/119* (2006.01)

(52) U.S. Cl. ......... 257/411; 257/406; 257/412; 257/388

(58) Field of Classification Search .................. 257/411, 257/406, 407, 410, 412, 413, 388, 383, 368, 257/154, 249, 314, 316–320, 331, 366, 387
See application file for complete search history.

(56) References Cited

U.S. PATENT DOCUMENTS

| | | | |
|---|---|---|---|
| 6,627,503 B2* | 9/2003 | Ma et al. ................. | 438/287 |
| 6,858,444 B2* | 2/2005 | Ahn et al. ................ | 438/3 |
| 7,125,762 B2* | 10/2006 | Brask et al. .............. | 438/197 |
| 7,785,964 B2* | 8/2010 | Park et al. ................ | 438/263 |
| 2004/0051134 A1* | 3/2004 | Jang et al. ................ | 257/316 |
| 2005/0051857 A1 | 3/2005 | Kawahara et al. | |

FOREIGN PATENT DOCUMENTS

| | | |
|---|---|---|
| JP | 2004-349627 | 12/2004 |
| JP | 2005-064317 | 3/2005 |
| JP | 2005-311061 | 4/2005 |
| JP | 2005-183422 | 7/2005 |
| JP | 2006-147804 | 6/2006 |
| JP | 2006-310801 | 9/2006 |

OTHER PUBLICATIONS

"Extended Abstracts" (The 55th Spring Meeting, 2008), No. 2, The Japan Society of Applied Physics and Related Societies, Mar. 27-30, 2008.
"Digest of Technical Papers", 2008 Symposium on VLSI Technology, The IEEE Electron Devices Society and The Japan Society of Applied Physics, Jun. 17-19, 2008.
Japanese Office Action mailed Nov. 9, 2010 2010 with partial trans.

* cited by examiner

*Primary Examiner* — Chuong A. Luu
(74) *Attorney, Agent, or Firm* — IPUSA, PLLC

(57) ABSTRACT

A disclosed semiconductor device includes a gate insulation film formed on a silicon substrate and a metal gate electrode formed in the gate insulation film, wherein the gate insulation film includes a first insulation film, a second insulation film that is formed on the first insulation film and has a greater dielectric constant than the first insulation film, and a third insulation film formed on the second insulation film.

2 Claims, 2 Drawing Sheets

SEMICONDUCTOR DEVICE

BACKGROUND OF THE INVENTION

1. Field of the Invention

The present invention relates to a semiconductor device and a fabrication method of the same, specifically, to a Metal Oxide Semiconductor (MOS) device having a gate insulation layer formed on a silicon substrate and a gate electrode formed on the gate insulation layer, and a fabrication method of such an MOS device.

2. Description of the Related Art

A Metal Oxide Semiconductor (MOS) device having a gate insulation layer formed on a silicon substrate and a gate electrode formed on the gate insulation layer has been widely used as a semiconductor device.

In a technology field of semiconductor devices, further miniaturization for high integration, high speed performance, low voltage operation, and the like have been demanded. In order to address such demands, further reduction of a gate insulation layer thickness is under vigorous investigation. Because gate leakage current due to a tunneling effect is increased when a conventional gate insulation layer made of silicon oxide is thinned, a so-called high-k (high dielectric constant) film such as $HfO_2$ (hafnium oxide) film may be used instead of silicon oxide.

When such a high-k insulation layer is employed along with a poly-silicon gate electrode, silicide may be formed between the insulation layer and the gate electrode. In order to avoid silicide formation, use of a stacked layer gate insulator including a silicon oxide film, a high-k film such as $HfO_2$ film formed on the silicon oxide film, and a metal nitride film formed on the high-k film has been proposed in an MOS device employing a poly-silicon gate electrode (See Japanese Patent Application Laid-Open Publication No. 2005-64317).

However, it is difficult to control a threshold voltage because of Fermi Level Pinning in the above MOS device, especially, a p-type MOS Field Effect Transistor (FET) device employing the poly-silicon gate electrode. In addition, when a metal gate electrode is used, it becomes difficult to control a threshold voltage because of flat-band voltage rolloff.

The present invention has been made in view of the above, and is directed to a semiconductor device where a threshold voltage can be controlled in an appropriate range and a flat-band voltage rolloff is suppressed, and a fabrication method of the same.

SUMMARY OF THE INVENTION

An embodiment of the present invention provides a semiconductor device including a gate insulation film formed on a silicon substrate and a metal gate electrode formed in the gate insulation film, wherein the gate insulation film includes a first insulation film, a second insulation film that is formed on the first insulation film and has a greater dielectric constant than the first insulation film, and a third insulation film formed on the second insulation film.

Another embodiment of the present invention provides a fabrication method of a semiconductor device. This fabrication method includes steps of forming a first insulation film on a silicon substrate; forming a second insulation film on the first insulation film, the second insulation film having a greater dielectric constant than the first insulation film; forming a third insulation film on the second insulation film; and forming a metal gate electrode on the third insulation film.

BRIEF DESCRIPTION OF THE DRAWINGS

According to embodiments of the present invention, a semiconductor device where a threshold voltage can be controlled in an appropriate range and a flat-band voltage rolloff is suppressed, and a fabrication method of the same are provided. Other objects, features and advantages of the present invention will become more apparent from the following detailed description when read in conjunction with the accompanying drawings, in which.

DETAILED DESCRIPTION OF THE PREFERRED EMBODIMENT

Figure 1:
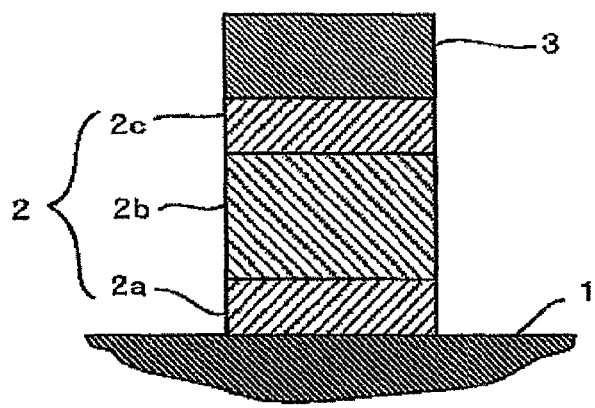
FIG. 1 is an explanatory view of a primary portion of a semiconductor device according to an embodiment of the present invention.

Non-limiting, exemplary embodiments of the present invention are described with reference to the accompanying drawings. In the drawings, the same or corresponding reference marks are given to the same or corresponding members or components. It is to be noted that the drawings are illustrative of the invention, and the specific thickness or size should be determined by a person having ordinary skill in the art in view of the following embodiments.

FIG. 1 illustrates a primary portion of a semiconductor device, which may be a p-type Metal Oxide Semiconductor Field Effect Transistor (PMOSFET), according to a first embodiment of the present invention. In FIG. 1, "1" represents a silicon substrate. A gate oxide film 2 is formed on the silicon substrate 1, and a metal gate electrode 3 is formed on the gate oxide film 2. The metal gate electrode 3 may be formed of W, Ti, Al, Ta, Pt, TiN, or the like.

The gate oxide film 2 includes a first insulation film 2a formed at the bottom (i.e., on the silicon substrate 1), a second insulation film 2b that is formed on the first insulation film 2a and has a dielectric constant greater than the dielectric constant of the first insulation film 2a, and a third insulation film 2c formed on the second insulation film 2b. The first insulation film 2a may be formed of $SiO_2$ and have a thickness of one to several nanometers. Specifically, the first insulation film 2a is 1 nanometer thick in this embodiment.

The second insulation film 2b is formed of a so-called high-k material (a material having a high dielectric constant), specifically, $HfO_2$ in this embodiment. In other embodiments, the second insulation film 2b may be formed of lanthanoid oxides, $Y_2O_3$, $Al_2O_3$, $ZrO_2$, or the like. The second insulation film 2b formed of $HfO_2$ may be several nanometers thick, specifically, about 3 nm thick in this example. The second insulation film 2b can be formed by an Atomic Layer Deposition (ALD) method, a Chemical Vapor Deposition (CVD) method, or the like.

The third insulation film 2c is formed of silicon oxide and has a thickness of 0.3 through 2 nm in this embodiment. The third insulation film 2c may be formed by the ALD (atomic layer deposition) method, the CVD (chemical vapor deposition) method, or the like. As stated, the gate oxide film 2 has a stacked layer structure including the first insulation film 2a, the second insulation film 2b, and the third insulation film 2c, which are deposited in this order on the silicon substrate 1.

Figure 2:
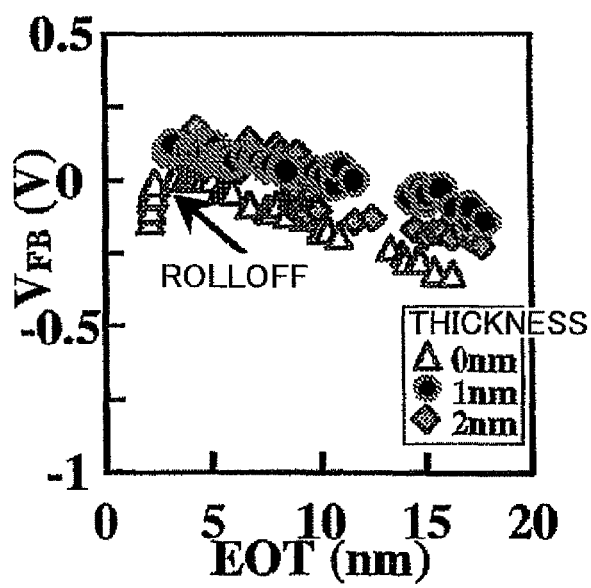
FIG. 2 is a graph of a relationship between a flat-band voltage and an equivalent oxide thickness, with various thicknesses of a third insulation film as a parameter.

In this embodiment, the third insulation film 2c is formed to be 0.3 through 2 nm thick. The reason why the thickness of the third insulation film 2c is in such a range may be explained in the following manner along with measurement results. FIG. 2 is a graph illustrating a relationship of a flat-band voltage (VFB) with respect to an equivalent oxide thickness (EOT). In this graph, open triangles indicate the VFBs for the gate oxide film 2 not including the third insulation film 2c (0 nm), closed circles indicate the VFBs for the gate oxide film 2 including the third insulation film 2c of about 1 nm thick, and open diamonds indicate the VFBs for the gate oxide film 2 including the third insulation film 2c of about 2 nm thick.

As shown by an arrow in FIG. 2, when the gate oxide film 2 does not include the third insulation film 2c, the flat-band voltage rolloff is observed. On the other hand, when the gate oxide film 2 includes the third insulation film 2c of about 1 nm or 2 nm thick, the flat-band voltage rolloff is suppressed.

Figure 3:
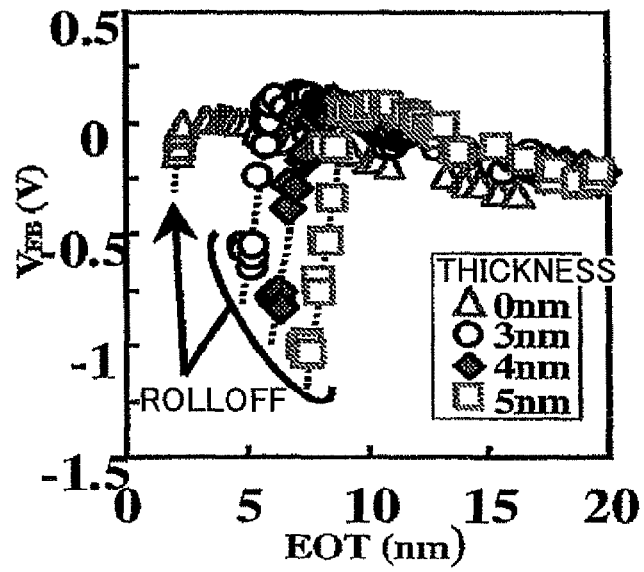
FIG. 3 is another graph of a relationship between the flat-band voltage and the equivalent oxide thickness, with various thicknesses of the third insulation film as a parameter.

FIG. 3 is another graph illustrating the flat-band voltages (VFB) with respect to the equivalent oxide thickness (EOT). In this graph, open triangles indicate the VFBs for the gate oxide film 2 not including the third insulation film 2c, open circles indicate the VFBs for the gate oxide film 2 including the third insulation film 2c of about 3 nm thick, closed diamonds indicate the VFBs for the gate oxide film 2 including the third insulation film 2c of about 4 nm thick, and open squares indicate the VFBs for the gate oxide film 2 including the third insulation film 2c of about 5 nm thick.

As shown in FIG. 3, when the third insulation film 2c is about 3 nm thick or more, the flat-band voltage rolloff is clearly observed. Namely, when the third insulation film 2c becomes 3 nm thick or more, no suppressing effect is demonstrated on the flat-band voltage rolloff, or the rolloff becomes rather significant.

Figure 4:
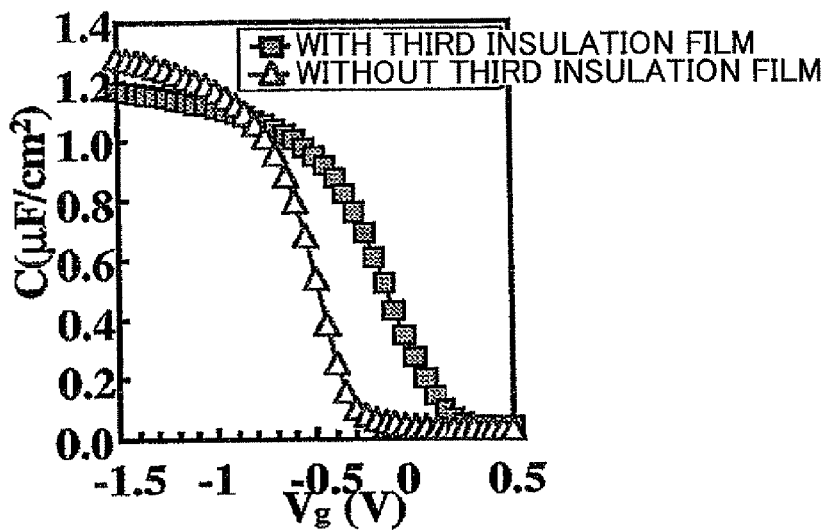
FIG. 4 shows different C-V curves depending on the absence/presence of the third insulation film.

FIG. 4 is a graph illustrating a relationship of capacitance C with respect to a gate voltage Vg. In this graph, open triangles indicate the capacitance for the gate oxide film 2 not including the third insulation film 2c, and closed squares indicate the capacitance for the gate oxide film 2 including the third insulation film 2c of about 0.3 nm thick. Use of the third insulation film 2c having the thickness of about 0.3 nm reduces a negative shift, as clearly understood when compared with the case where the third insulation film 2c is not employed.

Figure 5:
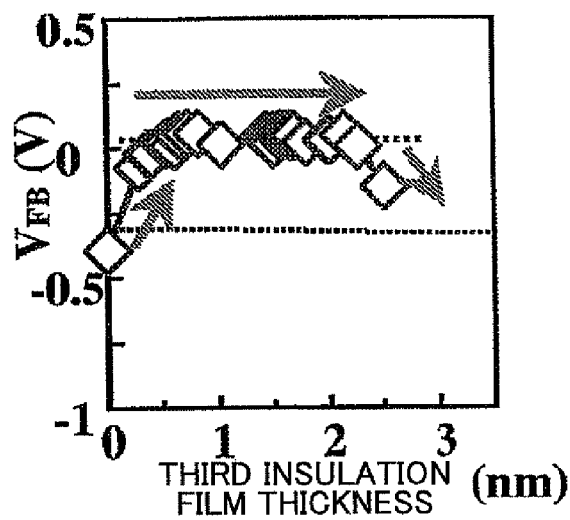
FIG. 5 is a graph of the flat-band voltage plotted with respect to the thickness of the third insulation film.

FIG. 5 is a graph of a relationship between a flat-band voltage (VFB), which is taken along the vertical axis, and a thickness of the third insulation film 2c, which is taken along the horizontal axis. A sample used for this measurement has the first insulation film 2a ($SiO_2$ film) of about 1 nm and the second insulation film 2b ($HfO_2$ film) of about 3 nm. As shown in this graph, a negative shift in the flat-band voltage is suppressed in a thickness range of 0.3 nm through 2 nm. From the foregoing, the third insulation film 2c is determined to be in such a thickness range in this embodiment. By setting the third insulation film 2c to fall within this range, a threshold voltage can be controlled in an appropriate range.

Figure 6:
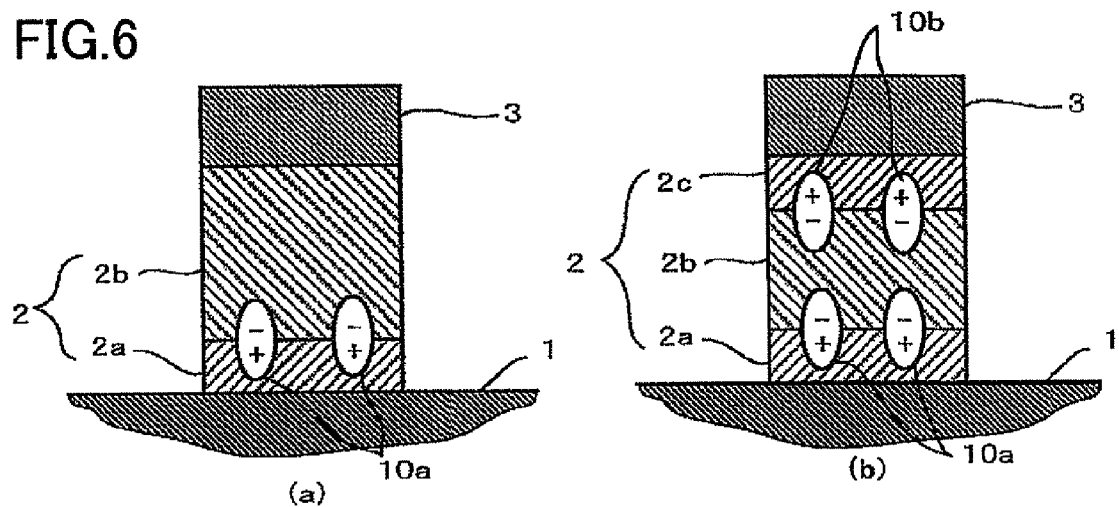
FIGS. 6A and 6B are schematic views for explaining a flat-band voltage rolloff mechanism.

The reason why the rolloff takes place may be explained in the following manner. When the third insulation film 2c is absent in the gate oxide film 2, oxygen atoms diffuse out from the second insulation film 2b during a heating process, leaving boundary dipoles 10a at the boundary between the first insulation film 2a and the second insulation film 2b, as shown in FIG. 6A. On the other hand, when the third insulation film 2c is present on the second insulation film 2b, boundary dipoles 10b are also created at the boundary between the second insulation film 2b and the third insulation film 2c. The boundary dipoles 10b may counterbalance the boundary dipoles 10a, thereby suppressing the flat-band voltage rolloff. According to this, when the third insulation film 2c becomes thick, the oxygen atoms in the second insulation film 2b are not likely to diffuse out. As a result, boundary dipoles having the same direction as the boundary dipoles 10a are created at the boundary between the second insulation film 2b and the third insulation film 2c, which may increase the flat-band voltage rolloff.

The present application is based on Japanese Patent Application No. 2008-239214, filed on Sep. 18, 2008 with the Japanese Patent Office, the entire content of which is hereby incorporated herein by reference.

What is claimed is:

1. A semiconductor device comprising:
   a gate insulation film formed on a silicon substrate, wherein the gate insulation film includes
   a first insulation film formed on the silicon substrate,
   a second insulation film that is formed on the first insulation film and has
   a greater dielectric constant than the dielectric constant of the first insulation film, and
   a silicon oxide film formed on the second insulation film, the silicon oxide film having a thickness of 0.3 nm through 2 nm; and
   a metal gate electrode formed on the gate insulation film.

2. The semiconductor device of claim 1, wherein the first insulation film comprises silicon oxide, and wherein the second insulation film comprises $HfO_2$.

* * * * *